United States Patent

[11] 3,603,845

[72] Inventor Howard L. Beers
River Forest, Ill.
[21] Appl. No. 53,461
[22] Filed July 9, 1970
[45] Patented Sept. 7, 1971
[73] Assignee Wescom, Inc.
Downers Grove, Ill.

[54] EXPANDABLE ENCLOSURE FOR PRINTED CIRCUIT CARDS AND THE LIKE

12 Claims, 4 Drawing Figs.

[52] U.S. Cl. .......... 317/117, 312/107, 312/263, 317/101 DH
[51] Int. Cl. .......... H05k 5/02, H02b 1/10
[50] Field of Search .......... 317/101 DH, 101 CB, 117, 118, 120, 121; 312/107, 108, 263; 339/17 M, 17 N, 17 LC

[56] References Cited

UNITED STATES PATENTS

| | | | |
|---|---|---|---|
| 1,817,307 | 8/1931 | Haase | 312/263 |
| 2,576,409 | 11/1951 | Michaelis | 312/107 |
| 3,245,546 | 4/1966 | Stuhler | 317/101 DH |

*Primary Examiner*—Lewis H. Myers
*Assistant Examiner*—Gerald P. Tolin
*Attorney*—Wolfe, Hubbard, Leydig, Voit & Osann

ABSTRACT: An expandable enclosure to house from one to several printed circuit cards and the like is assembled from a left- and a right-hand end section and, for multiple circuit cards, one or more center sections. Adjacent sections of the enclosure are interlocking, so that the only mechanical connectors required in the assembly are those that are required at any rate to mount the necessary electrical connectors. For over-and-under mounting of the enclosure on a conventional instrument or relay rack there are brackets which are horizontally adjustable relative to the rack but fixed relative to the enclosure, whereas for endwise mounting there are brackets that are fixed relative to the rack but vertically adjustable relative to the enclosure. Further for endwise mounting of the enclosure there are aligning pins extending laterally from either end of the enclosure and locating sockets on the brackets, such that the enclosure may be mounted without any skew relative to the rack by adjusting the vertical positions of the ends of the enclosure so that the aligning pins are received in corresponding ones of the locating sockets.

INVENTOR.
HOWARD L. BEERS,
BY
Wolfe, Hubbard, Leydig, Voit & Osann
ATTORNEYS.

INVENTOR.
HOWARD L. BEERS,
BY
Wolfe, Hubbard, Leydig, Voit & Osann
ATTORNEYS.

EXPANDABLE ENCLOSURE FOR PRINTED CIRCUIT CARDS AND THE LIKE

BACKGROUND OF THE INVENTION

The present invention relates to enclosures for printed circuit cards or boards and the like, and more particularly to modular, expandable enclosures therefor.

The general practice in the past has been to individually design and separately fabricate the different size enclosures required to house different numbers of printed circuit cards, boards, and the like, hereinafter collectively referred to as printed circuit cards. This has meant that many of the manufacturers of electrical equipment incorporating printed circuits, such as manufacturers for the telephone industry to name just one prominent, exemplary group, have had to incur the expense of such design and fabrication, as well as the expense and administrative inconvenience of the attendant inventory problems.

SUMMARY OF THE INVENTION

It is an object of this invention to provide a modular, expandable enclosure for printed circuit cards which incorporates a minimum of separately configured parts, but which may be expanded as desired to accommodate from one to several circuit cards. A more detailed related object is to provide an expandable enclosure of the foregoing type which comprises only three basic parts, but which may be expanded to house any number of circuit cards up to a limit imposed by the accumulation of the inherent dimensional inaccuracies of the parts.

Another object of the present invention is to provide a modular, expandable enclosure for printed circuit cards wherein the only mechanical connectors required to assemble the several modules or sections thereof are those used for mounting the electrical connectors which are employed to provide electrical contact between the circuit cards and associated circuitry, but wherein adjacent sections of the enclosure are nevertheless securely interlocked against movement relative to one another.

Still a further object of this invention is to provide an expandable enclosure of the foregoing type wherein each pair of adjacent sections defines upper and lower guide tracks which maintain a circuit card housed within the compartment formed by the adjacent sections and in alignment for electrical contact with an associated electrical connector.

Yet another object of this invention is to provide an expandable enclosure of the foregoing type with mounting brackets for either over-and-under of endwise mounting of the enclosure on conventional instrument or relay racks with a minimum of lost space between the enclosure and any adjacent equipment mounted on the same rack.

BRIEF DESCRIPTION OF THE DRAWINGS

Other objects and advantages of the present invention will become apparent when the following detailed description is read in conjunction with the attached drawings, in which.

DETAILED DESCRIPTION OF THE ILLUSTRATED EMBODIMENT

While the invention is described in detail hereinafter in connection with a particular embodiment and certain alternatives, it is to be understood that the intent is not to limit it thereto. To the contrary, the intent is to cover all modifications, alternatives and equivalents that fall within the spirit and scope of the invention ad defined by the appended claims.

Figure 1:
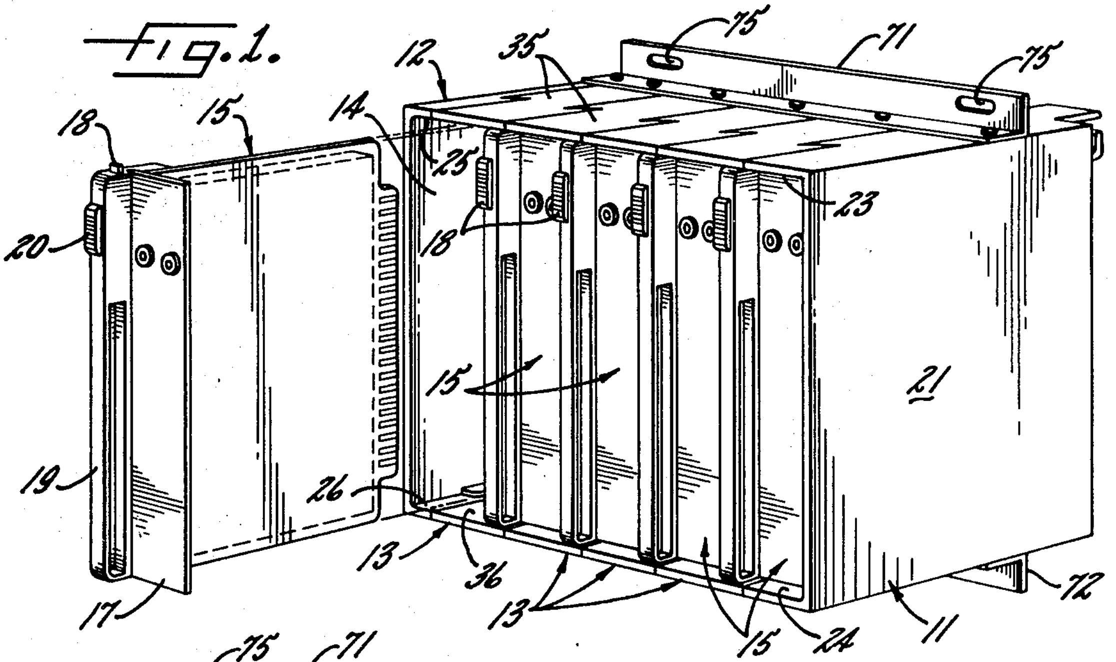
FIG. 1 is a perspective view of an expandable enclosure constructed in accordance with the present invention.
Figure 2:
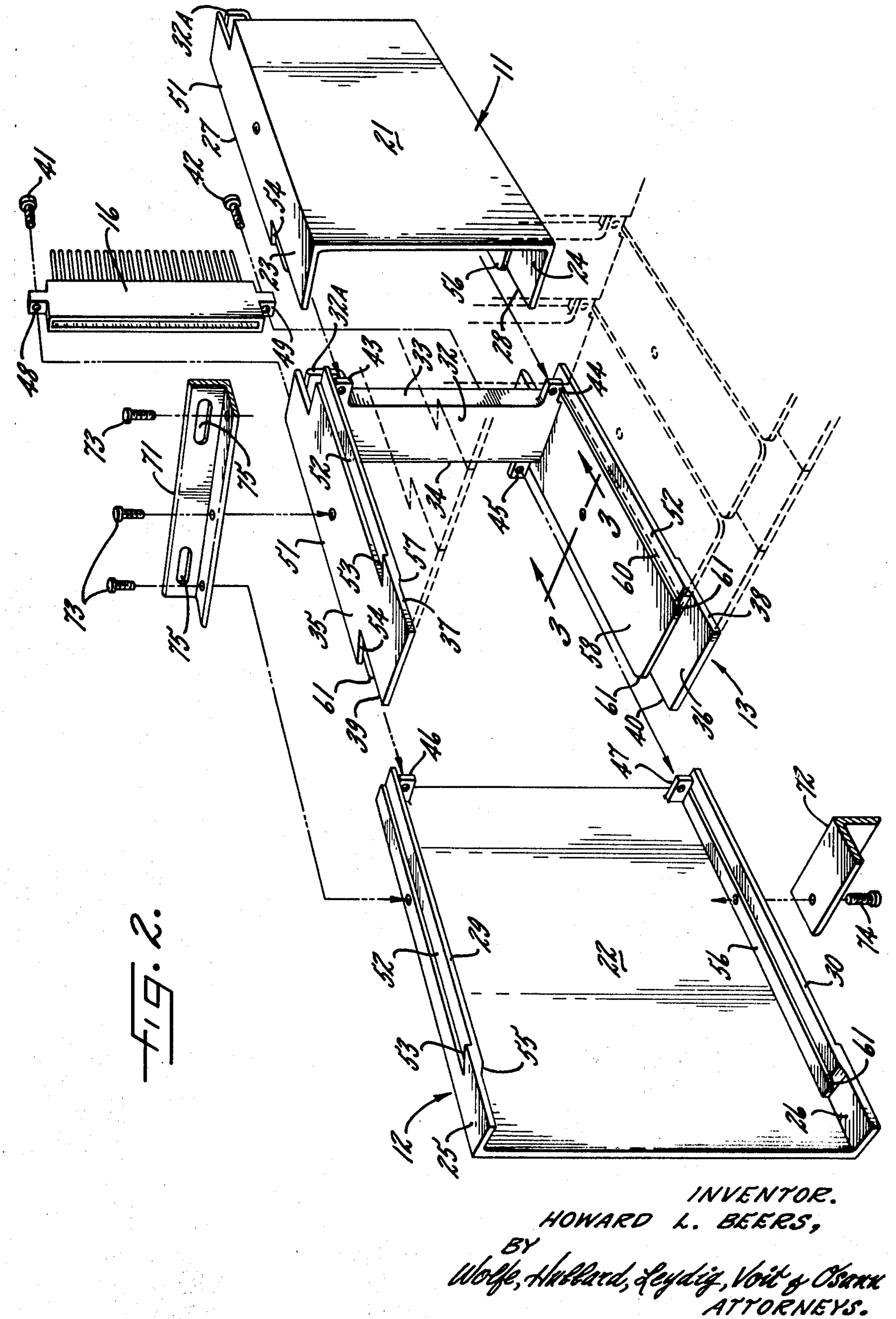
FIG. 2 is a fragmentary exploded view, partly in phantom, of the expandable enclosure shown in FIG. 1.

Turning now to the drawings, and particularly to FIGS. 1 and 2, it will be seen that the expandable enclosure here disclosed comprises three basic sections; viz, a right-hand end section 11, a left-hand end section 12, and a suitable number of center sections 13. The several sections of the enclosure are configured so that each adjacent pair of sections defines a compartment 14 for a printed circuit card 15. Hence, the number of center sections 13 required for any given enclosure is one less than the number of circuit cards 15 to be housed therein. The maximum number of circuit cards 15 that may be accommodated within a single enclosure by the addition of center sections 13 is limited only by the accumulation as the enclosure is expanded of the inherent dimensional inaccuracies of the sections, i.e., deviations of the dimensions thereof within the tolerance limitations imposed thereon. Thus, only the three basic sections 11, 12, and 13 need be stocked to insure the availability of a wide range of different size enclosures. To provide electrical contact between each of the printed circuit cards 15 and any other circuitry (not shown) associated therewith, an electrical connector 16 is mounted at the rear of each of the compartments 14.

The enclosure shown is open at its front or forward side for the easy insertion and removal of the circuit cards 15, but substantially closed at all other sides. Thus, when the necessary electrical connectors 16 are in place and the circuit cards 15 are inserted in electrical contact, here illustrated as board edge-type contact, with their respective electrical connectors 16, there is a substantially dust free, closed housing in which the circuit cards 15 are protected against the potentially damaging effects of being inadvertently brushed, snagged, or the like. To insure the integrity of the enclosure and to prevent the circuit cards 15 from being accidentally jarred or otherwise dislodged therefrom, each of the circuit cards 15 is preferably releasably locked in place by a catch mechanism, which may, as here shown, typically be formed by a spring-biased bolt 18 carried by the face plate 17 for the circuit card in position to be received within a cooperating notch (not shown) provided in the enclosure. For removal of any one of the circuit cards 15 from the enclosure, the face plate 17 for each circuit card may further include a handle 19 with a thumb slide 20 conveniently positioned thereon. The thumb slide 20 is mechanically coupled (by means not shown) to the bolt 18 so that the bolt may be manually retracted by operation of the slide.

Referring to FIG. 2 for a more detailed consideration of the configuration of the three basic sections for the enclosure, it will be seen that the end sections 11 and 12 comprise respective sidewalls 21 and 22 to define the right and left hand ends of the enclosure, and upper and lower walls 23, 24 and 25, 26 which extend inwardly from the respective sidewalls and terminate in free lateral edges 27–30. The center sections 13, on the other hand, include rear walls 32, which are relieved at either side as at 33 and 34 to accommodate and nest the necessary electrical connectors 16, and upper and lower walls 35 and 36, which are terminated at each side by free lateral edges 37, 38 and 39, 40. One of the end sections, in this instance the right-hand end section 11, further includes a rear wall (not shown) which extends inwardly from its sidewall 21 and which is relieved in much the same manner as shown at 34 for the left-hand sides of the rear walls 32 of the center section 13. Hence, it will be appreciated that the upper and lower walls of the end sections 11 and 12 and of any center sections 13 used define the top and bottom of the enclosure. Likewise, the rear walls of the right-hand end section 11 and of any center sections 13, together with the electrical connectors 16 nested thereby, define the back for the enclosure. Finally, it should be noted that to support the wiring harness (not shown) leading to and from the electrical connectors 16, there may be substantially L-shaped projections 32A extending rearwardly from the rear walls of the right-hand end section 11 and the center sections 13 to form a support trough.

Preferably, in the interest of simplifying the manufacture of the three basic sections 11, 12 and 13 for the enclosure and also insuring a high degree of part-to-part uniformity, each of them is fabricated by conventional molding or casting techniques and, therefore, of seamless, single-piece construction. However, it is to be understood that the sections may also be built up from plate stock or the like, without departing from the broader aspects of the instant invention.

In accordance with one of the more important aspects of the present invention, the three basic sections 11, 12 and 13 for the enclosure are configured so that any two of them may be assembled to provide a compartment for a printed circuit card 15 by simply inserting the mechanical connectors, typically machine screws 41 and 42, that are required at any rate to mount the necessary electrical connector 16. By virtue of an interlock between each adjacent pair of sections so assembled, movement of the assembled sections relative to one another is prevented, without any further mechanical connectors or other fastening means. Thus, it will be appreciated that the sections can be assembled relatively quickly by even unskilled personnel and without sophisticated tools or other equipment.

To carry out this aspect of the invention, each of the sections 11, 12 and 13 has a plurality of spaced-apart and bored mounting ears (only some of which can be seen at 43—47) which extend laterally therefrom rearwardly of the compartments 14 and into overlapping and aligned relationship with corresponding mounting ears of the next adjacent sections. The number and spacing of the mounting ears is selected to correspond to the requirements of the particular electrical connectors 16 that are employed. Thus, in the illustrated embodiment in which the electrical connector 16 has a pair of bored end tabs 48 and 49 for mounting purposes, each of the end sections 11 and 12 has a pair of mounting ears (such as can be seen at 46 and 47 for the left-hand end section 12) which extend laterally inwardly therefrom, while each of the center sections 13 has two pairs of mounting ears (both members of one pair can be seen at 43 and 44 and one member of the other pair can be seen at 45) each of which extends laterally outwardly from a respective side thereof. The mounting ears of the right-hand section 12 and the center sections 13 extend from the rear walls thereof, whereas the mounting ears of the left-hand end section 12 extend from a rearward portion of its sidewall 22. As will be noted, to insure that the mounting ears for each adjacent pair of sections overlap in aligned relationship and thereby accommodate the mechanical connectors 41 and 42, oppositely directed sets of mounting ears are longitudinally offset from one another. Moreover, in the illustrated embodiment, the bores of the rearmost mounting ears, such as 45, are clearance holes, whereas the bores of the foremost mounting ears, such as 43, 44, 46 and 47, are tapped.

Further in keeping with the foregoing aspect of the present invention, to provide the aforementioned interlock between the sections, the free lateral edges 27–30 and 37–40 of the upper and lower walls 23, 25, 35 and 24, 26, 36 of the sections alternately comprise longitudinally extending flanges 51 and flange seats 52. Each of the flange seats 52 is terminated at its forward end by a reentrant end wall 53, and each of the flanges 51 is terminated at its forward end by a matching face 54. The reentrant end wall and matching face terminations 53 and 54 are substantial compliments of one another. Thus, it will be understood that when the sections are assembled, the flanges 51 at the free lateral edges of the upper and lower walls of any one section seat on and interlock with the flange seats 52 at the adjacent free lateral edges of the upper and lower walls of the next section, and so on for successive adjacent pairs of sections, regardless of the number of sections used to form the enclosure.

Provision is made for aligning each circuit card 15 for electrical contact with its respective electrical connector 16. To this end, referring to FIGS. 2 and 3, for guiding the circuit cards 15 into and out of the compartments 14 provided by the enclosure, the inner surfaces of the upper and lower walls 23, 25, 35 and 24, 26, 36 of the sections 11, 12 and 13 are each inwardly stepped, as at 55 and 56 for the end sections 11 and 12, and 57 and 58 for the center sections 13. The upper and lower steps 55 and 56 for the end sections and the corresponding steps 57 and 58 for the center sections are each spaced a predetermined lateral distance from the free lateral edge or edges, as the case may be, of the upper and lower walls of their respective sections, so that when the sections are assembled there are recesses or tracks 59 and 60 respectively defined between the upper and lower steps of each adjacent pair of sections. The tracks 59 and 60 are vertically aligned with each other and longitudinally aligned with the electrical connector 16 mounted at the rear of the compartment 14 formed by the adjacent sections. Further, by virtue of the lateral spacing selected for the steps 55–58, the tracks 59 and 60 have a width substantially equal to the thickness of the circuit cards 15. Thus, when a circuit card 15 is inserted into any one of the compartments 14 of the enclosure, it is engaged at its upper and lower edges by a set of tracks 59 and 60 and guided thereby into electrical contact with the electrical connector 16 mounted at the rear of the particular compartment 14. To minimize the wear and tear on the circuit cards 15 as they are inserted into the enclosure, camming surfaces preferably are provided for aiding in the initial alignment of their upper and lower edges with their respective guide tracks 59 and 60. Typically, such camming surfaces are formed by beveling or rounding the forward corners of each of the steps 54–58, such as at 61, so that the throat or entrance for each track 59 and 60 is of substantially Y-shaped configuration.

In keeping with accepted practices, in use the enclosure is usually mounted, either by itself or along with other equipment, on a rack, generally referred to as an instrument rack or relay rack. Typically, conventional racks (not shown) comprise either generally horizontal parallel mounting bars for over-and-under mounting of equipment or generally vertical parallel mounting bars for endwise mounting. On either type of rack the mounting sites, usually preformed screw holes, are usually uniformly spaced at predetermined intervals along the lengths of the mounting bars. As will be noted, alternative provision is made for mounting the enclosure here disclosed, so that it can be mounted on either type of conventional rack in close proximity to any adjacent equipment.

Figure 3:
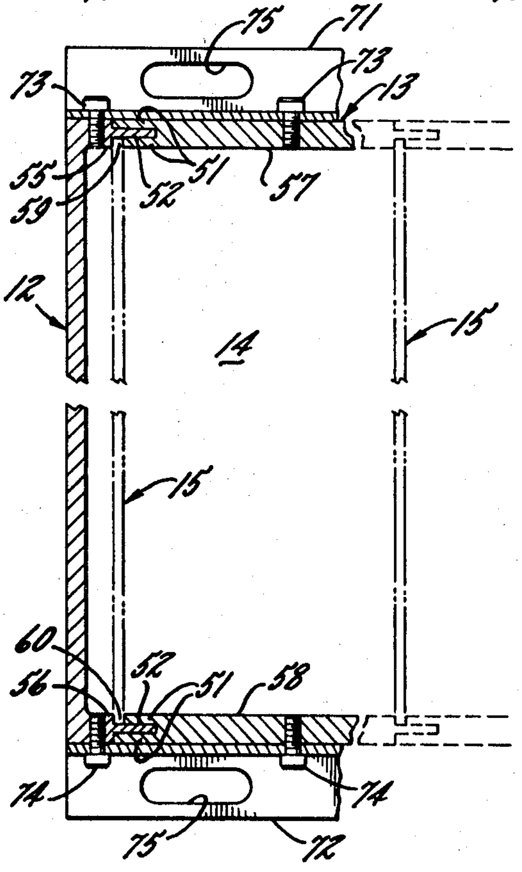
FIG. 3 is a fragmentary vertical section, partly in phantom, which is taken along the line 3—3 in FIG. 2 to illustrate the guide tracks that are provided to guide the circuit cards into and out of the enclosure and to align them for electrical contact with their respective electrical connectors.

More particularly, as illustrated in FIGS. 1–3, more or less conventional provision is made for over-and-under mounting of the enclosure. Specifically, there are upper and lower generally L-shaped mounting brackets 71 and 72, which are secured to the top and bottom of the enclosure, such as by machine screws 73 and 74, and which respectively extend upwardly and downwardly therefrom for attachment to upper and lower ones of a pair of generally horizontal parallel mounting bars (not shown). The brackets 71 and 72 have spaced apart, laterally elongated slots 75 to accommodate the usual machine screws or the like (also not shown) used to secure them to the mounting bars. Of course, the laterally elongated slots 75 enable the lateral position of the enclosure to be adjusted relative to the rack and any other equipment mounted thereon and, therefore, insure that the enclosure may be mounted in close proximity to any adjacent equipment.

Figure 4:
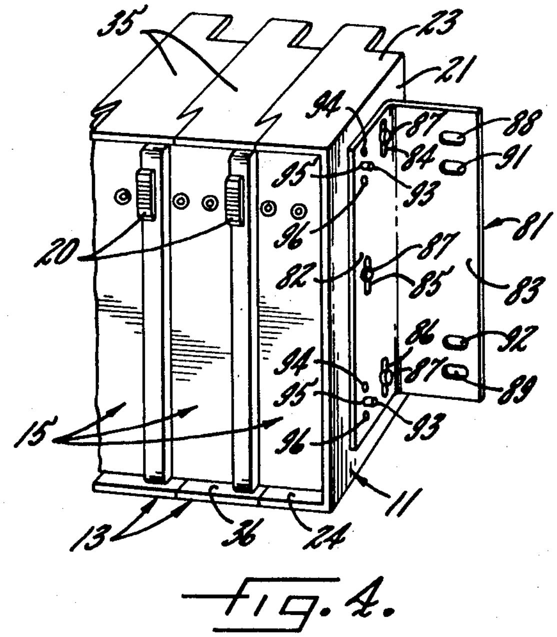
FIG. 4 is a fragmentary perspective view of the expandable enclosure, which illustrates a novel bracket arrangement for endwise mounting of the enclosure on a standard instrument or relay rack.

On the other hand, in keeping with one of the more detailed features of the present invention and as an alternative to known modes for endwise mounting of the enclosure on a rack comprised of generally vertical, parallel mounting bars (not shown), there is a novel endwise mounting arrangement for the enclosure depicted in FIG. 4. The novel arrangement has the advantage relative to known endwise mountings of virtually eliminating any tendency for the enclosure to skew relative to the rack, while still permitting its vertical position to be adjusted relative to the rack.

Specifically, as shown for one end of the enclosure, it being understood that identical provision is made for the other end, there is a generally L-shaped mounting bracket 81 comprised of an inner leg 82 and an outer leg 83. The inner leg 82 extends vertically of the enclosure and has spaced-apart, vertically elongated slots 84–86 therethrough, so that it can be secured to the enclosure end wall 21 by machine screws 87 or the like and so that the vertical position of the enclosure relative to the bracket 81 can be adjusted over a range substantially corresponding to the lengths of the slots 84–86. The outer leg 83 of the bracket 81, on the other hand, extends outwardly and generally laterally of the enclosure and has two sets of spaced-apart bores 88, 89 and 91, 92 formed therethrough to permit the bracket 81 to be secured by further machine screws or the like (not shown) to a mounting bar (also not shown) having either of two conventionally employed spacings between mounting sites e.g. spacings of 1 inch or 1 ¾inches).

To eliminate potential skewing of the enclosure relative to the mounting rack, such as might otherwise waste valuable mounting space, there are aligning pins 93 which extend in axially aligned pairs from each of the end walls 21 and 22, and for each of the aligning pins 93, a corresponding set of spaced-apart locating sockets or holes 94–96 formed through the inner legs 82 of the brackets 81. Preferably, to prevent the enclosure from pivoting around the aligning pins 93, there are, as shown, at least two pins extending from each of the end walls 21 and 22. The locating sockets 94–96 are positioned so that for each locating socket on the bracket 81 for one side of the enclosure, there is a substantially identically positioned locating socket on the other bracket 81, and the distance between the most remotely spaced locating sockets of each set, i.e., between the uppermost and lowermost sockets 94 and 96, is substantially equal to the lengths of the slots 84–86. Thus, it will be seen that regardless of how the enclosure is adjusted vertically relative to the brackets 81, all that need be done to insure that the enclosure is aligned and not skewed relative to the rack is to slightly adjust the ends of the enclosure relative to the brackets 81 to align the pins 93 at either end of the enclosure so that each is received in a corresponding one of the locating sockets 94–96 of the respective brackets 81. As will be appreciated, the aligning adjustment has no substantial effect on the vertical position of the enclosure relative to the brackets but simply ensures that the opposite ends of the enclosure are aligned.

From the foregoing, it will now be seen that the present invention provides an expandable enclosure which comprises only three basic sections or modules, but which can be expanded as desired to commonly house anywhere from one to several printed circuit cards. It will also be appreciated that the sections can be quickly assembled by even unskilled personnel to form an enclosure of any desired capacity. Finally, it will be understood that the enclosure lends itself to endwise mounting by an arrangement which permits vertical adjustment of the enclosure relative to any other equipment mounted on the same rack but which eliminates any tendency for the enclosure to skew relative to the rack.

I claim as my invention:

1. An expandable enclosure for housing printed circuit cards and the like, said enclosure comprising a plurality of joined sections including at least one adjacent pair, each adjacent pair including first and second sections and defining a corresponding compartment for a printed circuit card, the first and second sections of each pair having respective pluralities of spaced-apart mounting ears extending laterally rearwardly of said corresponding compartment into overlapping and aligned relationship for mounting an electrical connector and respective upper and lower walls with free lateral edges which respectively comprise first and second members of an interlock between said adjacent pair.

2. The expandable enclosure of claim 1 wherein said mounting ears are bored to receive mechanical connectors which are used for mounting electrical connectors and comprise the only fastening means required for joining said sections.

3. The expandable enclosure of claim 1 wherein the first member of each interlock comprises a longitudinally extending flange seat which is terminated at its forward end by a reentrant end wall, and the second member comprises a longitudinally extending flange which is terminated at its forward end by a matching face which is the substantial compliment of said reentrant end wall.

4. The expandable enclosure of claim 3 wherein said mounting ears are bored to receive mechanical connectors which are used for mounting electrical connectors and comprise the only fastening means required for joining of said sections.

5. The expandable enclosure of claim 1 wherein the upper and lower walls of each of said sections have inner faces which are inwardly stepped at a predetermined lateral distance from the free lateral edge thereof, whereby the stepped inner faces of the upper and lower walls of the sections of each adjacent pair respectively define upper and lower tracks for guiding a printed circuit card into said corresponding compartment in alignment for electrical contact with an electrical connector.

6. The expandable enclosure of claim 5 wherein said mounting ears are bored to receive mechanical connectors which are used for mounting electrical connectors and comprise the only fastening means required for joining of said sections.

7. The expandable enclosure of claim 6 wherein the first member of each interlock comprises a longitudinally extending flange seat which is terminated at its forward end by a reentrant end wall, and the second member comprises a longitudinally extending flange which is terminated at its forward end by a matching face which is the substantial compliment of said reentrant end wall.

8. The expandable enclosure of claim 1 wherein said enclosure comprises only three differently configured sections.

9. The expandable enclosure of claim 8 wherein said three sections are a right-hand end section, a left-hand end section, and at least one center section, whereby said enclosure has a plurality of adjacent pairs and a corresponding plurality of compartments.

10. The expandable enclosure of claim 9 further including respective electrical connectors mounted at the rear of said compartments and secured to said mounting ears by mechanical connectors and wherein the sections of said enclosure, together with the electrical connectors mounted thereon, provide a housing which is open at one side for the insertion and removal of circuit cards but substantially closed at all other sides, and said mechanical connectors are the only fastening means used for joining said sections.

11. The expandable enclosure of claim 1 further including first and second brackets for rack mounting of said enclosure, said brackets being positioned at opposite sides of said enclosure and each having a first leg secured to said enclosure and a second leg extending outwardly away therefrom.

12. The expandable enclosure of claim 11 wherein each of the first legs of said brackets has a plurality of elongated slots therethrough and is secured to said enclosure by mechanical connectors driven through said slots and into said enclosure whereby the position of said brackets relative to said enclosure is adjustable, and further including at least one pair of axially aligned aligning pins each extending outwardly from a respective one of the opposite sides of said enclosure, and for each of said pins a corresponding set of spaced-apart locating sockets formed on the first legs of said brackets, said locating sockets being positioned on said first and second brackets so that for each socket on said first bracket there is a substantially identically positioned corresponding socket on said second bracket, whereby the opposite sides of said enclosure may be aligned by adjusting them relative to the brackets so that their aligning pins are received in corresponding ones of the locating sockets on said first and second brackets.